(12) United States Patent
Nie et al.

(10) Patent No.: US 10,714,015 B2
(45) Date of Patent: *Jul. 14, 2020

(54) ORGANIC LIGHT EMITTING DIODE DISPLAY DEVICE

(71) Applicant: Shenzhen China Star Optoelectronics Semiconductor Display Technology Co., Ltd., Guangdong (CN)

(72) Inventors: Chenglei Nie, Guangdong (CN); Baixiang Han, Guangdong (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 121 days.

This patent is subject to a terminal disclaimer.

(21) Appl. No.: 15/579,700

(22) PCT Filed: Oct. 26, 2017

(86) PCT No.: PCT/CN2017/107825
§ 371 (c)(1),
(2) Date: Dec. 5, 2017

(87) PCT Pub. No.: WO2019/033552
PCT Pub. Date: Feb. 21, 2019

(65) Prior Publication Data
US 2019/0051249 A1    Feb. 14, 2019

(30) Foreign Application Priority Data

Aug. 14, 2017 (CN) .......................... 2017 1 0691567

(51) Int. Cl.
*G09G 3/3266* (2016.01)
*G09G 3/3275* (2016.01)

(52) U.S. Cl.
CPC .......... *G09G 3/3266* (2013.01); *G09G 3/3275* (2013.01); *G09G 2300/0426* (2013.01); *G09G 2310/0281* (2013.01)

(58) Field of Classification Search
CPC ........................... G09G 3/3266; G09G 3/3275
See application file for complete search history.

(56) References Cited

U.S. PATENT DOCUMENTS

2012/0306812 A1* 12/2012 Lai .................. G06F 3/0412
345/174
2015/0022737 A1   1/2015 Lee
(Continued)

FOREIGN PATENT DOCUMENTS

CN    101587266 A    11/2009
CN    104360558 A    2/2015
(Continued)

*Primary Examiner* — Sepehr Azari
(74) *Attorney, Agent, or Firm* — Muncy, Geissler, Olds & Lowe, P.C.

(57) ABSTRACT

In an organic light emitting diode (OLED) display device, a source driver chip is connected with the data lines through a plurality of first connection lines, and a gate driver chip connected with the scan lines through a plurality of second connection lines. The source driver chip and the gate driver chip are arranged on a same side of the OLED display device, and the first connection lines and the second connection lines are led from a side of the source driver chip.

14 Claims, 2 Drawing Sheets

(56) References Cited

U.S. PATENT DOCUMENTS

| | | |
|---|---|---|
| 2016/0163778 A1 | 6/2016 | Wang et al. |
| 2017/0069280 A1 | 3/2017 | Xu et al. |
| 2017/0169779 A1 | 6/2017 | Song et al. |

FOREIGN PATENT DOCUMENTS

| | | |
|---|---|---|
| CN | 204178340 U | 2/2015 |
| CN | 104865737 A | 8/2015 |
| CN | 105047122 A | 11/2015 |
| CN | 105372891 A | 3/2016 |
| CN | 106647066 A | 5/2017 |
| CN | 206322460 U | 7/2017 |

\* cited by examiner

ORGANIC LIGHT EMITTING DIODE DISPLAY DEVICE

BACKGROUND

Field

The present disclosure relates to a technical field of display devices, and more particularly to an organic light emitting diode (OLED) display device.

Background

Organic light-emitting diode (OLED) devices serve as a novel flat panel display technology, and have characteristics of being active light emitting, having wide viewing angles, high response speed, and flexible, such that OLED devices can be widely used, and have become promising next-generation display technology. Based on driving modes, the OLED display devices are divided into two display types of an active matrix organic light-emitting diode (AMOLED) in an active driving mode, and a passive matrix organic light-emitting diode (PMOLED) in a passive driving mode.

The active driving mode of the AMOLED is used in the OLED display devices used in mobile phones and the flat television sets. In the active driving mode, each sub-pixel of the display device is arranged by a thin film transistor (TFT) having a switch function and a storage capacitor. In additions, many gate lines, data input lines, and power supply lines are disposed around a display region. Because the gate lines, data input lines, and power supply lines are distributed on a periphery of the display device to form a frame region, this creates a larger frame region of the display device.

Therefore, it is necessary to provide an OLED display device to solve above-mentioned problems in related art.

SUMMARY OF DISCLOSURE

Embodiments of the present disclosure provide an organic light emitting diode (OLED) display device for decreasing a frame size of the display device.

To solve the above-mentioned problems, the present disclosure provides following solutions.

In a first embodiment, an OLED display device includes a plurality of scan lines, a plurality of data lines, a source driver chip, and a gate driver chip. The scan lines are configured to receive a scan signal. The data lines are configured to receive a data signal. The source driver chip is connected with the data lines through a plurality of first connection lines. The gate driver chip is connected with the scan lines through a plurality of second connection lines, wherein the source driver chip and the gate driver chip are arranged on a same side of the OLED display device, and the first connection lines and the second connection lines are led from a side of source driver chip.

In one embodiment of the OLED display device, each of the second connection lines comprises a horizontal portion parallel to the scan lines, and a vertical portion perpendicular to the scan lines.

In one embodiment of the OLED display device, a type of the OLED display device comprises a top emitting type or a bottom emitting type.

In one embodiment of the OLED display device, an extension direction of the second connection lines and the scan lines are inclined each other.

In one embodiment of the OLED display device, a type of the OLED display device comprises a top emitting type.

In one embodiment of the OLED display device, each of the scan lines corresponds to a primary gate driving unit and a secondary gate driving unit, the at least one primary gate driving unit is connected with the scan lines through a primary connection line. The at least one secondary gate driving unit is connected with the scan lines through a secondary connection line. The first terminals of the scan lines are connected with a terminal of the primary connection line. The second terminals of the scan lines are connected with a terminal of the secondary connection line.

In one embodiment of the OLED display device, the secondary connection line and the primary connection line are symmetrically arranged.

In one embodiment of the OLED display device, the source driver chip comprises a plurality of source driving units, and the gate driving units and the source driving units are arranged at intervals and in an interlaced structure.

In a second embodiment, an OLED display device includes a plurality of scan lines, a plurality of data lines, a source driver chip, and a gate driver chip. The scan lines are configured to receive a scan signal. The data lines are configured to receive a data signal. The source driver chip is connected with the data lines through a plurality of first connection lines. The gate driver chip is connected with the scan lines through a plurality of second connection lines, wherein the source driver chip and the gate driver chip are arranged on a same side of the OLED display device, and the first connection lines and the second connection lines are led from a side of source driver chip. A plurality of first terminals of the second connection lines are connected with the source driver chip, and a plurality of second terminals of the second connection lines are connected with a plurality of first terminals of the scan lines. The gate driver chip comprises a plurality of gate driving units having at least one primary gate driving unit and at least one secondary gate driving unit, and the at least one primary gate driving unit and the at least one secondary gate driving unit are symmetrically arranged.

In one embodiment of the OLED display device, each of the second connection lines comprises a horizontal portion parallel to the scan lines, and a vertical portion perpendicular to the scan lines.

In one embodiment of the OLED display device, a type of the OLED display device comprises a top emitting type or a bottom emitting type.

In one embodiment of the OLED display device, an extension direction of the second connection lines and the scan lines are inclined each other. In other words, the scan lines 11 are arranged at a horizontal direction and the extension direction of the second connection lines 14 have a preset angle relative to the horizontal direction.

In one embodiment of the OLED display device, a type of the OLED display device comprises a top emitting type.

In one embodiment of the OLED display device, a plurality of first terminals of the second connection lines are connected with the source driver chip, a plurality of second terminals of the second connection lines are connected with a plurality of first terminals of the scan lines.

In one embodiment of the OLED display device, the gate driver chip comprises a plurality of gate driving units having at least one primary gate driving unit and at least one secondary gate driving unit, and the at least one primary gate driving unit and the at least one secondary gate driving unit are symmetrically arranged.

In one embodiment of the OLED display device, each of the scan lines corresponds to a primary gate driving unit and a secondary gate driving unit, the at least one primary gate driving unit is connected with the scan lines through a primary connection line. The at least one secondary gate driving unit is connected with the scan lines through a secondary connection line. The first terminals of the scan lines are connected with a terminal of the primary connection line. The second terminals of the scan lines are connected with a terminal of the secondary connection line.

In one embodiment of the OLED display device, the secondary connection line and the primary connection line are symmetrically arranged.

In one embodiment of the OLED display device, the source driver chip comprises a plurality of source driving units, and the gate driving units and the source driving units are arranged at intervals and in an interlaced structure.

DETAILED DESCRIPTION OF PREFERRED EMBODIMENTS

The following embodiments refer to the accompanying figures for exemplifying specific implementable embodiments of the present disclosure in a suitable computing environment. It should be noted that the exemplary described embodiments are configured to describe and understand the present disclosure, but the present disclosure is not limited thereto. Directional terms, such as an upper side, a lower side, a front side, a back side, a left side, a right side, an inner side, an outer side, and a lateral side, mentioned in the present disclosure are only for reference. Therefore, the directional terms are used for describing and understanding rather than limiting the present disclosure. In the figures, units having similar structures use the same reference numbers.

Figure 1:
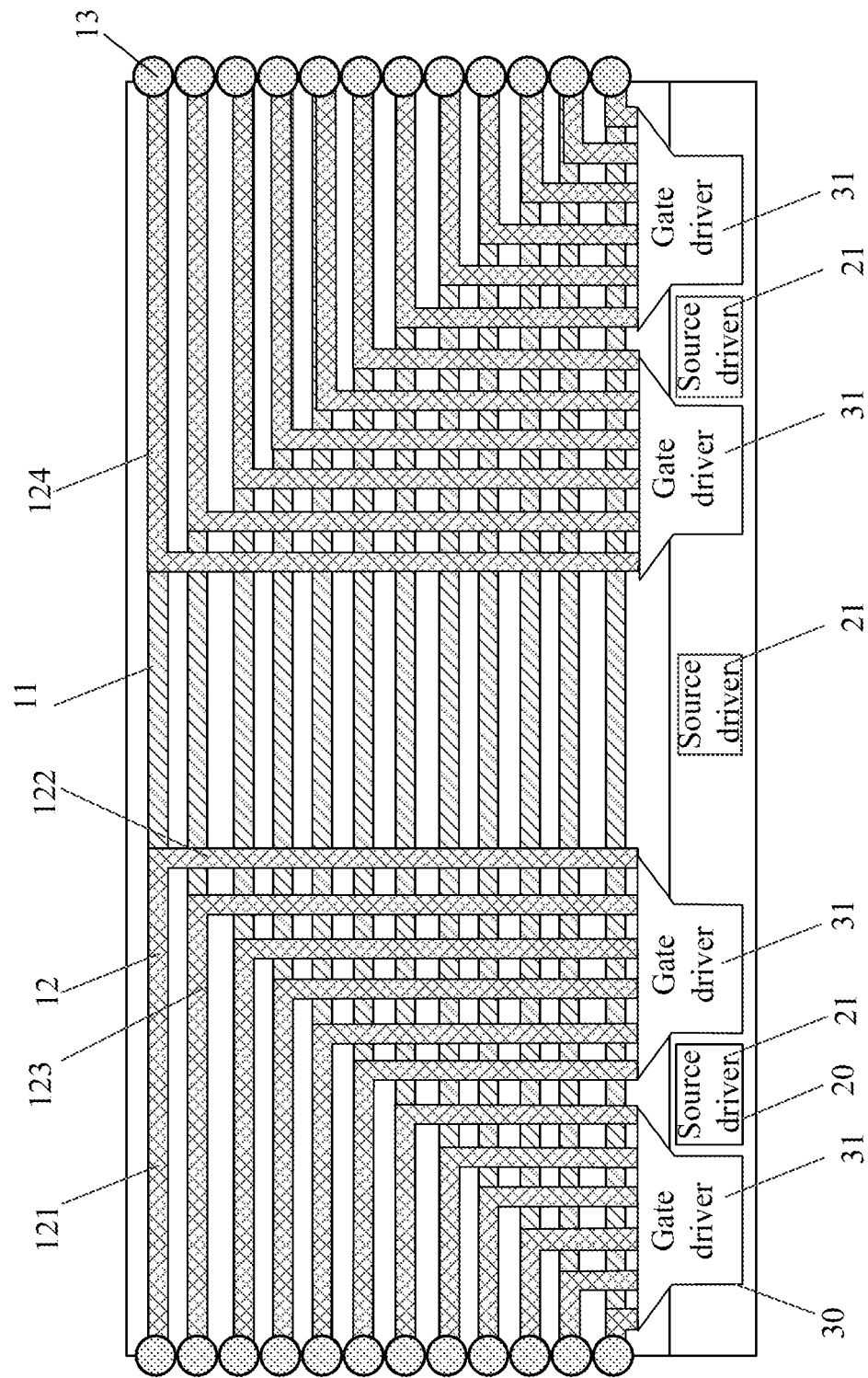
FIG. 1 is an illustrative structural diagram of an organic light emitting diode (OLED) display device according to one embodiment of the present disclosure.

In an embodiment, as shown in FIG. 1, an organic light-emitting diode display device includes a plurality of scan lines 11, a plurality of data lines (not shown), a source driver chip 20, and a gate driver chip 30. The scan lines 11 are configured to receive a scan signal, and the data lines are configured to receive a data signal.

The source driver chip 20 is connected with the data lines through a plurality of first connection lines for inputting the data signal to the data lines. The source driver chip 20 includes a plurality of source driving units 21, and the source driving units 21 are arranged at intervals.

The gate driver chip 30 is connected with the scan lines 11 through a plurality of second connection lines 12. The source driver chip 20 and the gate driver chip 30 are arranged on a same side of the OLED display device, and the first connection lines and the second connection lines 12 are led from a side of source driver chip 20.

The gate driver chip 30 includes a plurality of gate driving units 31. The gate driving units 31 and the source driving units 21 are arranged at intervals and in an interlaced structure.

The gate driving units 31 includes at least one primary gate driving unit and at least one secondary gate driving unit. For example, two gate driving units 31 located on the left side of the display device are defined as primary gate driving units, and two gate driving units 31 located on the right side of the display device are defined as secondary gate driving units. The at least one primary gate driving unit and the at least one secondary gate driving unit are symmetrically arranged. For example, the primary gate driving unit and the secondary gate driving unit are symmetrically arranged each other along a central axis relative to a vertical direction of the display device.

In one embodiment, the source driver chip 20 and the gate driver chip 30 are arranged below the OLED display device. The first connection lines and the second connection lines 12 are led out from a lower portion of the OLED display device.

In one embodiment, each of the second connection lines 12 includes a horizontal portion 121 parallel to the scan lines 11, and a vertical portion 122 perpendicular to the scan lines 11. In another embodiment, the horizontal portion 121 is parallel to the data lines.

In one embodiment, a type of the OLED display device includes a top emitting type or a bottom emitting type.

A plurality of first terminals of the second connection lines 12 are connected with the gate driver chip 30, and a plurality of second terminals of the second connection lines 12 are connected with a plurality of first terminals of the scan lines 11. The first terminals of the second connection lines 12 are connected with the first terminals of the scan lines 11 through via holes 13.

In other words, the first terminals of the second connection lines 12 are connected with the gate driving units 31, and a plurality of second terminals of the second connection lines 12 are connected with a plurality of first terminals of the scan lines 11.

In one embodiment, the at least one primary gate driving unit corresponds to the at least one secondary gate driving unit. In other words, a number of the at least one primary gate driving unit is same as a number of the at least one secondary gate driving unit. Each of the scan lines 11 corresponds to a primary gate driving unit and a secondary gate driving unit. The at least one primary gate driving unit is connected with the scan lines 11 through primary connection lines 123. The at least one secondary gate driving unit is connected with the scan lines 11 through secondary connection lines 124. The first terminals of the scan lines 11 are connected with terminals of the primary connection lines 123. The second terminals of the scan lines 11 are connected with terminals of the secondary connection lines 124. The secondary connection lines 124 and the primary connection lines 123 are symmetrically arranged. For example, the primary connection lines 123 and the secondary connection lines 124 are symmetrically arranged each other along a central axis relative to a vertical direction of the display device. In other words, the primary connection lines 123 are defined as scan connection lines that are located on the left side of the display device. The secondary connection lines 124 are defined as scan connection lines that are located on the right side of the display device. Thus, the second connection lines 12 include two types of the primary connection lines 123 and the secondary connection lines 124.

Since the gate driver chip is arranged on a same side of the source driver chip, and connection lines of the scan lines and connection lines of the data lines are also led out from a side of the source driver chip, the a circuit wiring area of the display device is reduced, thereby decreasing a frame size of the display device.

In the OLED display device of the present disclosure, the gate driver chip and the source driver chip are arranged on the same side of the display device, and connection lines of the scan lines and connection lines of the data lines are also led out from a side of the source driver chip, such that the a non-display area of the display device is reduced, thereby decreasing the frame size of the display device.

Figure 2:
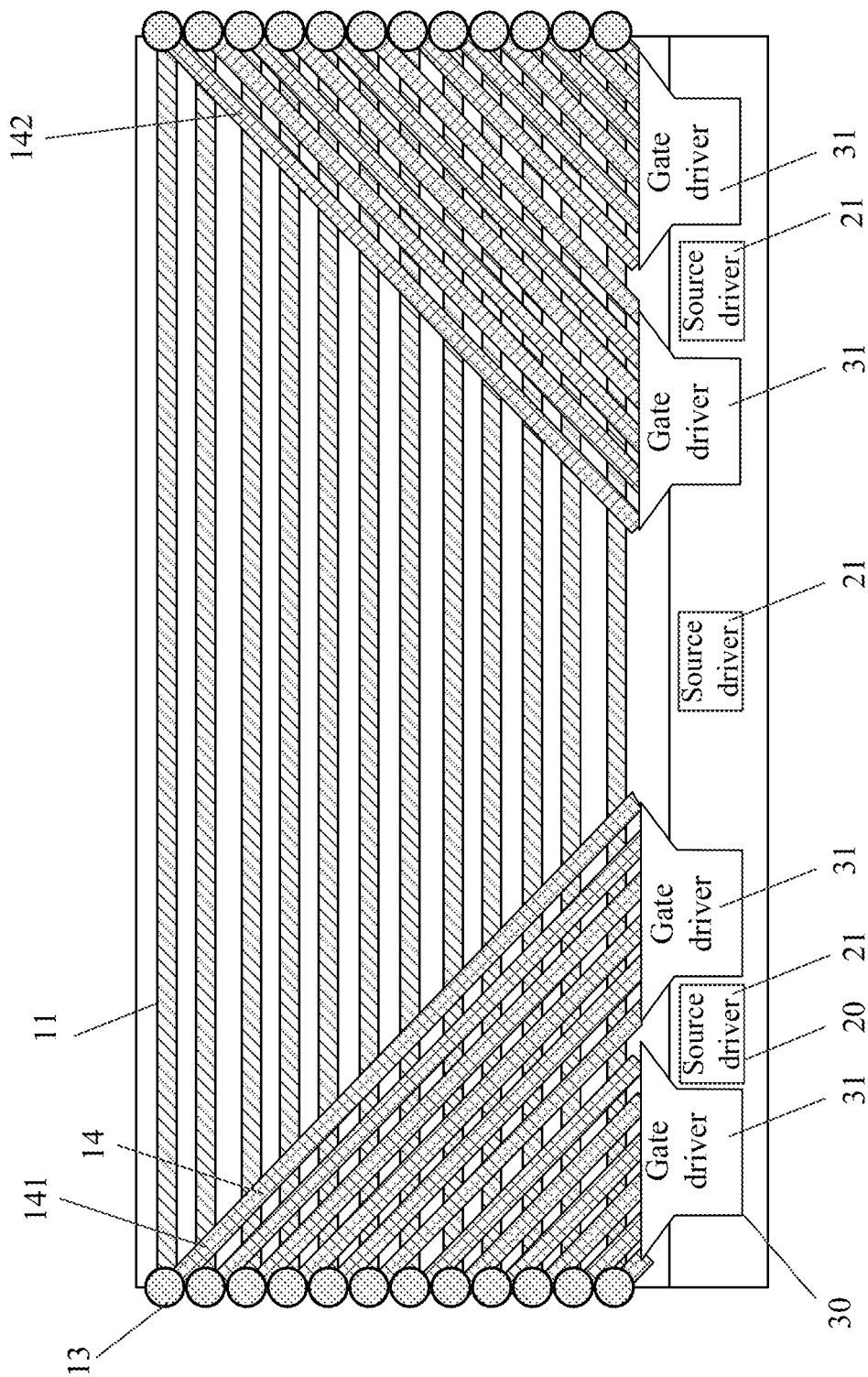
FIG. 2 is an illustrative structural diagram of the OLED display device according to another embodiment of the present disclosure.

In another embodiment, as shown in FIG. 2, an organic light-emitting diode display device includes a plurality of scan lines 11, a plurality of data lines (not shown), a source driver chip 20, and a gate driver chip 30. The scan lines 11 are configured to receive a scan signal, and the data lines are configured to receive a data signal.

The source driver chip 20 is connected with the data lines through a plurality of first connection lines for inputting the data signal to the data lines. The source driver chip 20 includes a plurality of source driving units 21, and the source driving units 21 are arranged at intervals.

The gate driver chip 30 is connected with the scan lines 11 through a plurality of second connection lines 12. The source driver chip 20 and the gate driver chip 30 are arranged on a same side of the OLED display device, and the first connection lines and the second connection lines 12 are led from a side of source driver chip 20.

The gate driver chip 30 includes a plurality of gate driving units 31. The gate driving units 31 and the source driving units 21 are arranged at intervals and in an interlaced structure.

The gate driving units 31 includes at least one primary gate driving unit and at least one secondary gate driving unit. For example, two gate driving units 31 located on the left side of the display device are defined as primary gate driving units, and two gate driving units 31 located on the right side of the display device are defined as secondary gate driving units. The at least one primary gate driving unit and the at least one secondary gate driving unit are symmetrically arranged. For example, the primary gate driving unit and the secondary gate driving unit are symmetrically arranged each other along a central axis relative to a vertical direction of the display device.

In one embodiment, the source driver chip 20 and the gate driver chip 30 are arranged below the OLED display device. The first connection lines and the second connection lines 12 are led out from a lower portion of the OLED display device.

In one embodiment, an extension direction of the second connection lines 14 and the scan lines 11 are inclined with respect to each other. In other words, the scan lines 11 are arranged at a horizontal direction and the extension direction of the second connection lines 14 have a preset angle relative to the horizontal direction, as shown in FIG. 2.

In other words, the second connection lines 14 are in a preset angle with the scan lines 11. For example, the second connection lines 14 are straight or curved lines. When the second connection lines 14 are straight lines, the extension direction of the second connection lines 14 are a length direction of the second connection lines 14. When the second connection line 14 are curved lines, the extension direction of the second connection lines 14 are a length change direction of the curve lines.

In one embodiment, a type of the OLED display device includes a top emitting type.

A plurality of first terminals of the second connection lines 14 are connected with the gate source driver chip 30, and a plurality of second terminals of the second connection lines 14 are connected with a plurality of first terminals of the scan lines 11. The first terminals of the second connection lines 14 are connected with the first terminals of the scan lines 11 through via holes 13.

In other words, the first terminals of the second connection lines 14 are connected with the gate driving units 31, and a plurality of second terminals of the second connection lines 14 are connected with a plurality of first terminals of the scan lines 11.

In one embodiment, the at least one primary gate driving unit corresponds to the at least one secondary gate driving unit. In other words, a number of the at least one primary gate driving unit is same as a number of the at least one secondary gate driving unit. Each of the scan lines 11 corresponds to a primary gate driving unit and a secondary gate driving unit. The at least one primary gate driving unit is connected with the scan lines 11 through primary connection lines 141. The at least one secondary gate driving unit is connected with the scan lines 11 through secondary connection lines 142. The first terminals of the scan lines 11 are connected with terminals of the primary connection lines 141. The second terminals of the scan lines 11 are connected with terminals of the secondary connection lines 142. The secondary connection lines 142 and the primary connection lines 141 are symmetrically arranged. For example, the primary connection lines 141 and the secondary connection lines 142 are symmetrically arranged each other along a central axis relative to a vertical direction of the display device. In other words, the second connection lines 14 include two types of the primary connection lines 141 and the secondary connection lines 142.

In one embodiment, the primary connection lines 141 are parallel to each other, and the secondary connection lines 142 are also parallel to each other. A distance between every two adjacent primary connection lines 141 is the same, and a distance between every two adjacent secondary connection lines 142 is same.

Because the gate driver chip is arranged on a same side of the source driver chip, and connection lines of the scan lines and connection lines of the data lines are also led out from a side of the source driver chip, the a circuit wiring area of the display device is reduced, thereby decreasing a frame size of the display device.

In the OLED display device of the present disclosure, the gate driver chip and the source driver chip are arranged on the same side of the display device, and connection lines of the scan lines and connection lines of the data lines are also led out from a side of the source driver chip, such that the a non-display area of the display device is reduced, thereby decreasing the frame size of the display device.

As is understood by a person skilled in the art, the foregoing preferred embodiments of the present disclosure are illustrative rather than limiting of the present disclosure. It is intended that they cover various modifications and similar arrangements be included within the spirit and scope of the present disclosure, the scope of which should be accorded the broadest interpretation so as to encompass all such modifications and similar structures.

What is claimed is:

1. An organic light emitting diode (OLED) display device, comprising:
a plurality of scan lines configured to receive a scan signal;
a plurality of data lines configured to receive a data signal;
a source driver chip connected with the data lines through a plurality of first connection lines; and
a gate driver chip connected with the scan lines through a plurality of second connection lines, wherein the source driver chip and the gate driver chip are arranged on a same side of the OLED display device, and the first connection lines and the second connection lines are led from a side of source driver chip;

wherein a plurality of first terminals of the second connection lines are connected with the gate driver chip, and a plurality of second terminals of the second connection lines are connected with a plurality of first terminals of the scan lines;

wherein the gate driver chip comprises a plurality of gate driving units having at least one primary gate driving unit and at least one secondary gate driving unit, and the at least one primary gate driving unit and the at least one secondary gate driving unit are symmetrically arranged; and wherein the scan lines are arranged at a horizontal direction and an extension direction of the second connection lines inclines to the scan lines at an acute angle in a display area, terminals of the second connection lines are connected with terminals of the scan lines through via holes in the display area, the via holes are vertically arranged with each other, the via holes are formed on a same edge of the display area along a same vertical axis, and the same vertical axis is perpendicular to the scan lines.

2. The OLED display device according to claim 1, wherein a type of the OLED display device comprises a top emitting type or a bottom emitting type.

3. The OLED display device according to claim 1, wherein a type of the OLED display device comprises a top emitting type.

4. The OLED display device according to claim 1, wherein each of the scan lines corresponds to a primary gate driving unit and a secondary gate driving unit, the at least one primary gate driving unit is connected with the scan lines through a primary connection line, and the at least one secondary gate driving unit is connected with the scan lines through a secondary connection line, wherein the first terminals of the scan lines are connected with a terminal of the primary connection line, and the second terminals of the scan lines are connected with a terminal of the secondary connection line.

5. The OLED display device according to claim 1, wherein the secondary connection line and the primary connection line are symmetrically arranged.

6. The OLED display device according to claim 1, wherein the source driver chip comprises a plurality of driving units, and the gate driving units and the driving units are arranged at intervals and in an interlaced structure.

7. An organic light emitting diode (OLED) display device, comprising:
a plurality of scan lines configured to receive a scan signal;
a plurality of data lines configured to receive a data signal;
a source driver chip connected with the data lines through a plurality of first connection lines; and
a gate driver chip connected with the scan lines through a plurality of second connection lines, wherein the source driver chip and the gate driver chip are arranged on a same side of the OLED display device, and the first connection lines and the second connection lines are led from a side of source driver chip; and wherein the scan lines are arranged at a horizontal direction and an extension direction of the second connection lines inclines to the scan lines at an acute angle in a display area, terminals of the second connection lines are connected with terminals of the scan lines through via holes in the display area, the via holes are vertically arranged with each other, and the via holes are formed on a same edge of the display area along a same axis.

8. The OLED display device according to claim 7, wherein a type of the OLED display device comprises a top emitting type or a bottom emitting type.

9. The OLED display device according to claim 7, wherein a type of the OLED display device comprises a top emitting type.

10. The OLED display device according to claim 7, wherein a plurality of first terminals of the second connection lines are connected with the gate driver chip, a plurality of second terminals of the second connection lines are connected with a plurality of first terminals of the scan lines.

11. The OLED display device according to claim 7, wherein the gate driver chip comprises a plurality of gate driving units having at least one primary gate driving unit and at least one secondary gate driving unit, and the at least one primary gate driving unit and the at least one secondary gate driving unit are symmetrically arranged.

12. The OLED display device according to claim 11, wherein each of the scan lines corresponds to a primary gate driving unit and a secondary gate driving unit, the at least one primary gate driving unit is connected with the scan lines through a primary connection line, and the at least one secondary gate driving unit is connected with the scan lines through a secondary connection line, wherein the first terminals of the scan lines are connected with a terminal of the primary connection line, and the second terminals of the scan lines are connected with a terminal of the secondary connection line.

13. The OLED display device according to claim 11, wherein the primary connection line and the secondary connection line are symmetrically arranged.

14. The OLED display device according to claim 11, wherein the source driver chip comprises a plurality of driving units, and the gate driving units and the driving units are arranged at intervals and in an interlaced structure.

* * * * *